United States Patent [19]
Conn

[11] Patent Number: 6,008,666
[45] Date of Patent: Dec. 28, 1999

[54] VARIABLE-DELAY INTERCONNECT STRUCTURE FOR A PROGRAMMABLE LOGIC DEVICE

[75] Inventor: Robert O. Conn, Los Gatos, Calif.

[73] Assignee: Xilinx, Inc., San Jose, Calif.

[21] Appl. No.: 09/053,875

[22] Filed: Apr. 1, 1998

[51] Int. Cl.[6] .................................................... G06F 7/38
[52] U.S. Cl. ............................... 326/39; 326/37; 326/41; 326/38
[58] Field of Search ................................ 326/37, 38, 39, 326/41, 45, 44, 47; 327/393, 395, 370, 403, 404

[56] References Cited

U.S. PATENT DOCUMENTS

| | | |
|---|---|---|
| Re. 34,363 | 8/1993 | Freeman . |
| 4,795,964 | 1/1989 | Shetti ........................................ 324/60 |
| 5,204,559 | 4/1993 | Deyhimy ................................. 307/480 |
| 5,426,378 | 6/1995 | Ong ............................................ 326/39 |
| 5,481,563 | 1/1996 | Hamre ..................................... 375/226 |
| 5,581,199 | 12/1996 | Pierce et al. ............................. 326/41 |
| 5,625,288 | 4/1997 | Snyder et al. ........................... 324/158 |
| 5,841,296 | 11/1998 | Churcher et al. ......................... 326/49 |

OTHER PUBLICATIONS

"Signal Delay in RC Tree Networks," IEEE Transactions on Computer–Aided Design, vol. CAD–2, No. 3, Jul. 1983, pp. 202–211.

"The Programmable Logic Data Book", Sep. 1996, pp. 4–24 to 4–29 available from Xilinx, Inc., 2100 Logic Drive, San Jose, California 95124.

Xilinx Application Note XAPP056, entitled "System Design with New XC4000X I/O Features, v. 1.2", published Nov. 1997, available from Xilinx, Inc., 2100 Logic Drive, San Jose, California 95124.

*Primary Examiner*—Michael Tokar
*Assistant Examiner*—A. Tran
*Attorney, Agent, or Firm*—Arthur J. Behiel, Esq.; Lois D. Cartier

[57] ABSTRACT

Described is a user-controlled, variable-delay interconnect structure for a programmable logic device (PLD), and a method for using this structure. In accordance with the invention, the signal propagation delays for selected signal paths can be precisely adjusted either while the PLD is being programmed or while the PLD is operating as a logic device. The delays are adjusted by selectively connecting otherwise unused interconnect lines to the signal path to increase the capacitive load on the interconnect lines that define the signal path. The ability to control the load on selected signal paths advantageously enables a user to precisely match the signal propagation delays of two or more signal paths. In one embodiment, the loads of selected signal paths can be modified while the FPGA is operational.

16 Claims, 2 Drawing Sheets

VARIABLE-DELAY INTERCONNECT STRUCTURE FOR A PROGRAMMABLE LOGIC DEVICE

CROSS-REFERENCE TO RELATED APPLICATION

This application relates to the following commonly assigned, co-pending U.S. patent applications:

Ser. No. 09/053879 [docket X-388 US] by Robert O. Conn and Peter H. Alfke entitled "USER-CONTROLLED DELAY CIRCUIT FOR A PROGRAMMABLE LOGIC DEVICE", and Ser. No. 08/710,465 [docket X-252 US] by Robert O. Conn entitled "METHOD FOR CHARACTERIZING INTERCONNECT TIMING CHARACTERISTICS USING REFERENCE RING OSCILLATOR CIRCUIT", which are incorporated herein by reference.

BACKGROUND OF THE INVENTION

1. Field of the Invention

The invention relates to field programmable gate arrays (FPGAs), and in particular to a structure and method for dynamically adjusting the delay on an FPGA interconnect line.

2. Description of the Background Art

Programmable logic devices (PLDs) are a well known type of digital integrated circuit (IC) that may be programmed by a user (e.g., a circuit designer) to perform specified logic functions. PLDs are becoming ever more popular, largely because they are less expensive and require less time to implement than semi-custom and custom integrated circuits.

One type of PLD, the field programmable gate array (FPGA), typically includes a matrix of configurable logic blocks (CLBs) embedded in a configurable interconnect structure. This collection of configurable logic may be customized by loading configuration data into internal configuration memory cells that define the logic functions of the individual CLBs and the signal paths through the interconnect structure. The configuration data may be read from memory (e.g., an external PROM) or written into the FPGA from an external device. The collective states of the individual memory cells then determine the logic function of the FPGA. For a detailed description of one type of FPGA interconnect structure, see Kerry M. Pierce, et al., "Interconnect Architecture For a Field Programmable Gate Array Using Variable Length Conductors," U.S. Pat. No. 5,581,199, issued Dec. 3, 1996, which is incorporated herein by reference.

FIG. 1A is a simplified schematic diagram of a portion of a typical interconnect structure 100. An input terminal 105, typically from a CLB, connects to a horizontal interconnect line 110 via a buffer 120. Horizontal interconnect line 110 is broken into segments 110A–110C via a pair of programmable pass transistors 115A and 115B. A number of identical programmable buffers 125A–125H electrically isolate horizontal interconnect line 110 from vertical interconnect lines 130A–130H. (The terms "horizontal" and "vertical" are used herein for ease of illustration, and do not necessarily describe the precise physical layout of interconnect structure 100.)

A set of memory cells 140A–140C controls the states of the corresponding transistors 135A–135C. Vertical interconnect line 130A can be selectively connected to one or more destination lines 132A–132C by programming the corresponding one of memory cells 140A–140C to turn on respective transistors 135A–135C. Vertical interconnect lines 130B–130H typically include similar transistors; however, those transistors are not shown in FIG. 1A, for ease of illustration.

A specific FPGA interconnect configuration is implemented by defining selected paths through the interconnect structure (e.g., by programming selected ones of programmable pass transistors 115A and 115B, programmable buffers 125A–125H, and memory cells 140A–140C). For example, if a specified logic configuration requires that input terminal 105 be connected to destination line 132A, memory cell 140A is programmed to store a logic one, thereby turning on transistor 135A.

Interconnect line 110 is shown as including two pass transistors 115A and 115B; however, an FPGA interconnect line may include a great many more than two pass transistors. The collective resistances of these series-connected pass transistors can introduce a significant cumulative resistance. Additionally, each interconnect line, buffer, and pass transistor introduces a parasitic capacitance that combines with the inherent resistances of interconnect structure 100 to produce signal propagation delays.

FIG. 1B is an expanded view of the contents of block 145 of FIG. 1A. The parasitic capacitances of various capacitive elements are illustrated using dashed lines to distinguish them from discrete components. Block 145 is shown rotated 90 degrees counter-clockwise with respect to FIG. 1A, for ease of illustration.

Buffer 125A is shown as a conventional CMOS buffer in FIG. 1B, although it may be programmable. Buffer 125A isolates interconnect line segment 110A from the load associated with interconnect line 130A. However, this isolation is not perfect, as a parasitic capacitance 150 capacitively couples the input and output terminals of buffer 125A. Other important parasitic capacitances include capacitors to ground, such as a capacitance 155 associated with interconnect line 130A and capacitances 160A–160C associated with respective destination lines 132A–132C.

When all of transistors 135A–135C are off, capacitances 160A–160C are effectively electrically isolated from interconnect line 110A. The capacitive load on interconnect line 110A is therefore proportional to the series capacitance of capacitances 150 and 155, the value of which is somewhat less than the value of the smaller of capacitances 150 and 155. The combined loading of capacitances 150 and 155 increases the signal propagation delay of interconnect line 110 by some small amount, perhaps on the order of picoseconds.

Turning on transistor 135A connects capacitance 160A in parallel with capacitance 155. Parallel capacitances are additive, so turning on transistor 135A increases the capacitive load on interconnect line 130A to a value proportional to the sum of capacitances 155 and 160A. Thus, with transistor 135A turned on, the capacitive load on interconnect line 110A becomes proportional to the series capacitance of capacitance 150 and the combined capacitances 155 and 160A. This increased capacitive loading imposes a longer delay in interconnect line 110A than would be evident were transistor 135A turned off. Similarly, turning on additional transistors (e.g., 135B and 135C) further increases the capacitive load, and therefore the delay, of interconnect line 110.

The signal paths chosen through interconnect structure 100 are conventionally governed by algorithms implemented in software routines. An FPGA user may exercise some control over the signal paths chosen by the software, but it is not practical for the user to control a significant number of signal paths in a given circuit design. Therefore, the software is left to choose among a large number of different interconnect line and destination line combinations to realize a particular signal path. Unfortunately, this diversity of interconnection combinations means that the delay between two nodes on an FPGA may vary significantly, depending upon the routing choices made by the software. Thus, the myriad possible paths that advantageously make interconnect structure 100 flexible can disadvantageously lead to unpredictable signal propagation delays. There is therefore a need for an interconnect structure in which signal propagation delays can be adjusted for optimum performance.

FPGA performance might also be improved for handling serial data communications. Various modulation schemes have been devised to encode data into a serial format, allowing that data to be conveyed over a single electrical or optical conductor. Such schemes are conventionally self-clocking, which is to say that the clock used to interpret the input signal is derived from the input signal itself. Unfortunately, many random and systematic perturbations typically corrupt the signal. These perturbations can cause the timing relationship between the derived clock and the data signal to vary, causing noise conditions commonly referred to as "drift" and "jitter." These conditions differ in that drift occurs over a time period that is long relative to the period of the derived clock, whereas jitter occurs over a time period that is short relative to the period of the derived clock. Hamre provides a more detailed discussion of jitter, including conventional methods for measuring jitter, in U.S. Pat. No. 5,481,563, which is incorporated herein by reference.

FPGAs can be particularly sensitive to jitter and drift due to the potential for unpredictable delay periods associated with the interconnect structure. There is therefore a need for a mechanism for testing an FPGA for jitter and/or drift sensitivity, and for adjusting signal propagation delays where necessary to eliminate such sensitivity.

SUMMARY OF THE INVENTION

The present invention is directed to an FPGA interconnect structure and method in which signal propagation delays can be precisely adjusted either while programming the FPGA or while the FPGA is operating as a logic device. The interconnect structure conventionally includes a number of interconnect lines that are each adapted to receive input signals and convey those signals to selected destinations on the FPGA. As with conventional interconnect structures, the selected destination can be controlled by programming one or more memory cells to define a signal path. Unlike conventional interconnect structures, however, otherwise unused interconnect lines of the interconnect structure can be selectively connected to (or disconnected from) the signal path to modify the load on the interconnect lines that define the signal path. This modified load changes the signal propagation delay of the selected signal path.

The ability to control the load on selected signal paths advantageously enables a user to precisely match the signal propagation delays of two or more signal paths, or to adjust the timing relationship between the signal paths. Moreover, because the present invention allows the loads on signal paths to be actively modified, the amount of signal propagation delay on a given signal path can be adjusted while the FPGA is operational. This flexibility allows a user to induce jitter or drift in a selected signal to test for sensitivity to these instabilities, or to adjust signal propagation delays continuously to maintain optimum timing relationships as circuit parameters vary. Other advantageous uses for a user-controlled delay circuit are described in the above incorporated application entitled "User-Controlled Delay Circuit for a Programmable Logic Device."

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

Figure 1A:
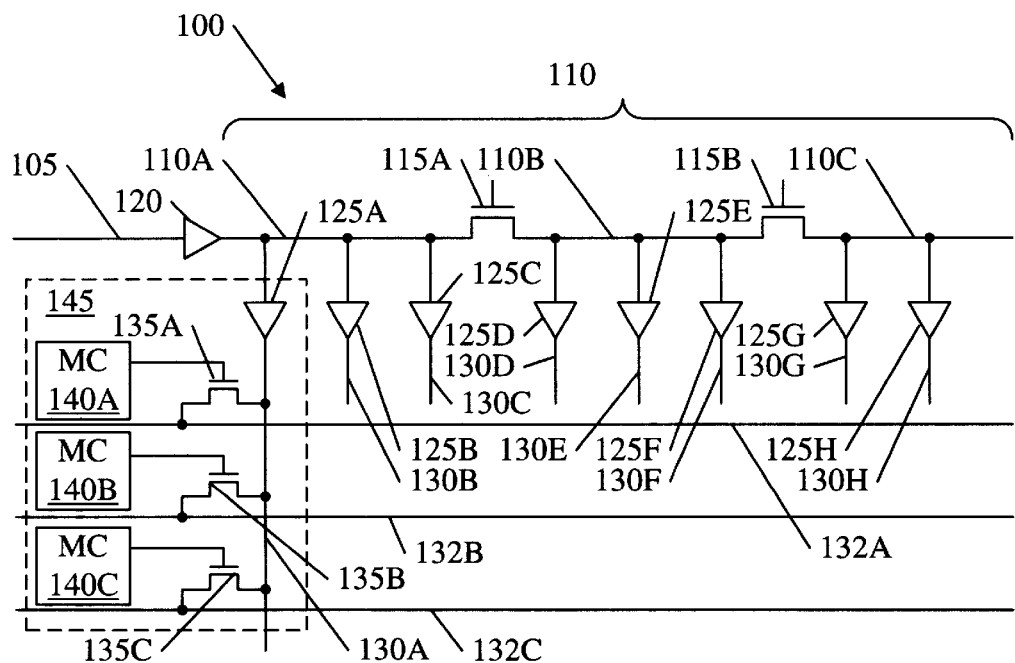
FIG. 1A is a simplified schematic diagram of a portion of a typical interconnect structure 100.
Figure 1B:
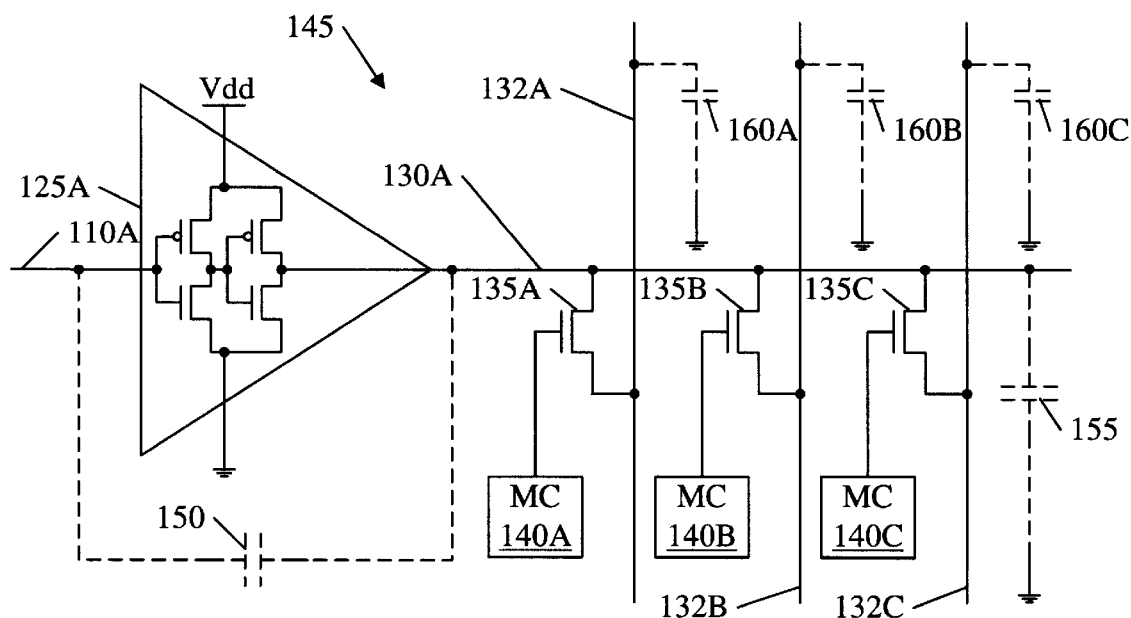
FIG. 1B is an expanded view of the contents of block 145 of FIG. 1A.
Figure 2:
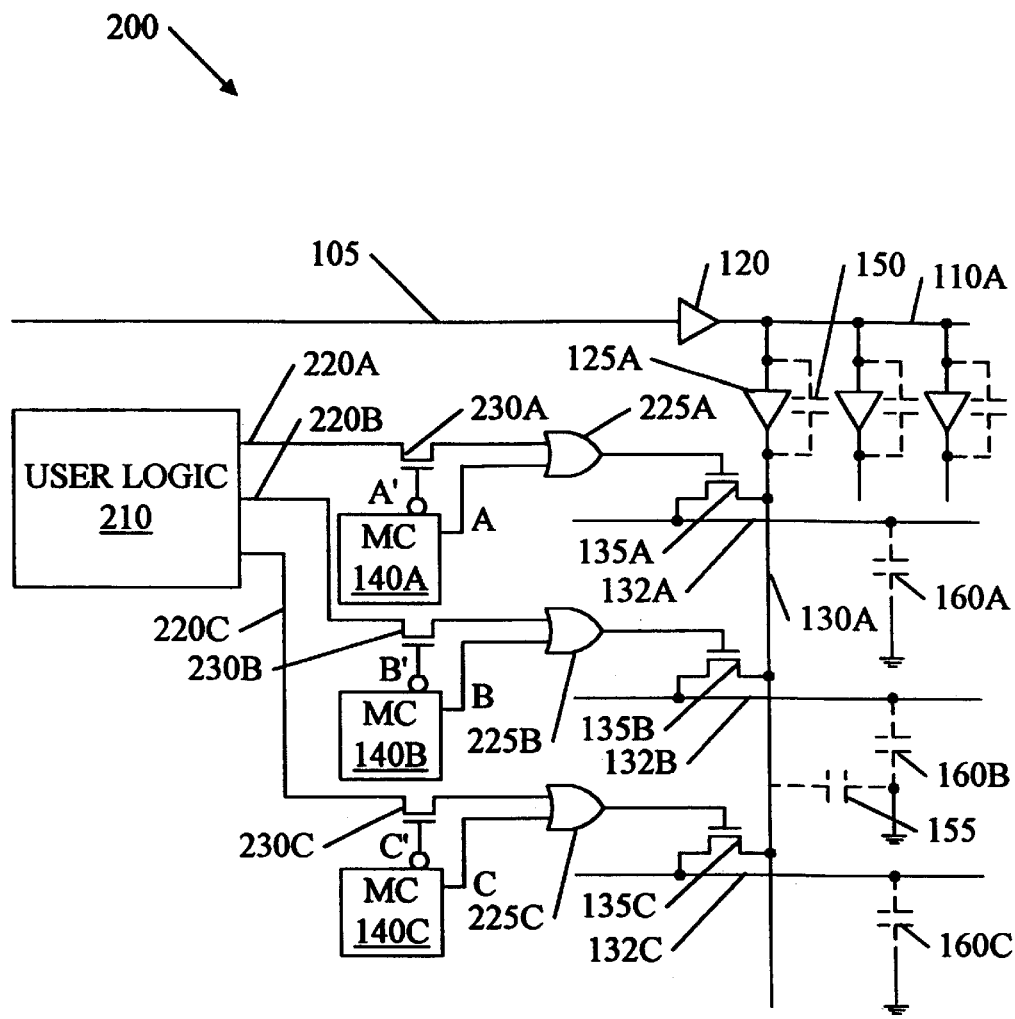
FIG. 2 is a simplified schematic diagram of a portion of an interconnect structure 200 modified in accordance with the present invention.

FIG. 2 is a simplified schematic diagram of a portion of an interconnect structure 200 modified in accordance with the present invention. Many components of interconnect structure 200 are identical to those of interconnect structure 100 of FIGS. 1A and 1B.

One important difference between interconnect structure 200 and interconnect structure 100 involves the control of transistors 135A–135C. Instead of being solely controlled by the states of memory cells 140A–140C, transistors 135A–135C can also be manipulated by user logic 210, which may be, for example, a CLB or an FPGA input block. The ability to actively control transistors 135A–135C allows a user to intentionally adjust the delay associated with a given signal path through interconnect structure 200 in very small increments. Such adjustments can be accomplished when interconnect structure 200 is first programmed or while interconnect structure 200 is operational (i.e., while the FPGA is functioning as a logic device).

User logic 210 includes three output terminals 220A–220C. These output terminals are connected to input terminals of respective two-input OR-gates 225A–225C via respective transistors 230A–230C. The second input terminals of OR-gates 225A–225C are connected to respective output terminals A through C of memory cells 140A–140C. Memory cells 140A–140C include complimentary output terminals A' through C', which is to say that the signals on output terminals A through C are the logical opposites of the signals on respective complementary output terminals A' through C'. Complementary output terminals A' through C' are connected to the control terminals of respective transistors 230A–230C. Memory cells with complementary output terminals are well known.

The interconnection point defined by transistor 135A (and those defined by transistors 135B and 135C) can operate in one of two modes. In the first operational mode, memory cell 140A turns on transistor 135A by providing a logic one (power high) on output terminal A to OR-gate 225A. The complementary output A' simultaneously turns transistor 230A off, effectively isolating output terminal 220A of user logic 210 from OR-gate 225A. Thus configured, interconnect segment 110A is connected to destination line 132A in the manner described above in connection with the conventional interconnect structure 100 of FIGS. 1A and 1B. A conventional pull-down resistor (not shown) having a first terminal connected to the line in between transistor 230A and OR-gate 225A and a second terminal connected to ground potential ensures that a logic zero is presented to OR gate 225A when transistor 230A is turned off.

In the second operational mode, memory cell 140A provides a logic zero (e.g., zero volts) on line A and a logic one on line A' to the control terminal of transistor 230A. User logic 210 then determines whether transistor 135A is on or off by selecting the appropriate logic level on output terminal 220A.

For ease of illustration, only a few interconnect lines and destination lines are depicted in FIG. 2. However, conventional interconnect structures typically include a far greater number of lines, thus providing a large number of possible delay periods (i.e., a high degree of delay granularity). The delay of a typical signal path through an interconnect structure might be adjusted, for example, by a total of two nanoseconds in increments on the order of tens of picoseconds.

The effect of destination-line loading can be increased, if desired, by adding additional capacitance in parallel with capacitance 150, or even by eliminating buffer 125A–125C. The effect of either such modification is to increase the loading effect on interconnect line 110A. Interconnect structure 200 can also be modified to allow user logic 210 to control pass transistors 115A and 115B (see FIG. 1A) to affect further changes in signal propagation delay. In another embodiment, pass transistors controlled by user logic 210 selectively connect discrete capacitors to interconnect structure 200 to affect changes in signal propagation delay. This embodiment is generally less preferred than the foregoing embodiments because it requires that additional capacitive elements be added to interconnect structure 200.

User logic 210 selectively controls the delay through interconnect structure 200 on line 110A. Fast, random changes in delay can be used to simulate jitter; slow, predictable increases (or decreases) in delay can be used to simulate drift. For example, user logic 210 can be used to create a jitter generator by implementing user logic 210 as a random number generator. Such an embodiment would turn on random combinations of transistors 135A–135C for random periods of time. These random combinations would, in turn, induce random changes in the signal propagation delay between input terminal 105 and a selected destination, typically a CLB input terminal. The resulting signal arriving at the selected destination would resemble a jittering signal. Alternatively, user logic 210 can progressively increase or decrease the delay associated with interconnect line 110 to simulate drift, or two or more interconnect paths could be load-matched to achieve identical or nearly identical delays despite their having differently configured signal paths.

In one embodiment, the delay on line 110A with respect to one or more signals on other lines can be deliberately adjusted by using simple feedback to user logic 210.

The signal paths chosen through interconnect structure 200 are selected by software, as discussed above in the background section. Such software can be modified, if necessary, to allow floating destination lines (i.e., destination lines without associated destinations), or destination lines that otherwise do not affect the logic function of the FPGA. (Some currently-available routing software routinely ties floating interconnect lines to ground unless instructed to do otherwise.) These available lines can then be used for delay adjustment according to the invention, avoiding signal conflicts that might otherwise occur.

While the present invention has been described in connection with specific embodiments, variations of these embodiments will be obvious to those of ordinary skill in the art. For example, each memory cell 140A–140C in FIG. 2 can be replaced by a pair of memory cells, one controlling a respective transistor 230A–230C and another providing input to a respective OR-gate 225A–225C. In this embodiment, connection of a line 132A–132C to line 130A can be steadily on, steadily off, or controlled by user logic 210. For another example, the user-controlled interconnect lines described above can be used as variable delay lines that have many applications, including those described in the above-incorporated application entitled "User-Controlled Delay Circuit for a Programmable Logic Device." Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Therefore, the spirit and scope of the appended claims should not be limited to the foregoing description.

What is claimed is:

1. An interconnect structure for a programmable logic device, the interconnect structure comprising:

an interconnect line having a first input terminal adapted to receive a first input signal and a first output terminal removed from the first input terminal;

a first destination line;

a first pass transistor having a first current-handling terminal connected to the interconnect line, a second current-handling terminal connected to the first destination line, and a control terminal; and a first user-controlled logic element providing an output signal on a logic-element output terminal connected to the control terminal of the first pass transistor, whereby a user can intentionally adjust a delay on a path from the first input terminal to the first output terminal of the interconnect line, wherein the first destination line is a programmable interconnect line that is otherwise unused.

2. The interconnect structure of claim 1, wherein the logic element is a configurable logic block.

3. An interconnect structure for a programmable logic device, the interconnect structure comprising:

an interconnect line having a first input terminal adapted to receive a first input signal and a first output terminal removed from the first input terminal;

a first destination line;

a first pass transistor having a first current-handling terminal connected to the interconnect line, a second current-handling terminal connected to the first destination line, and a control terminal; and a first user-controlled logic element providing an output signal on a logic-element output terminal connected to the control terminal of the first pass transistor, whereby a user can intentionally adjust a delay on a path from the first input terminal to the first output terminal of the interconnect line, wherein the logic element comprises a logic-element input terminal adapted to receive a second input signal from a source external to the programmable logic device.

4. An interconnect structure for a programmable logic device, the interconnect structure comprising:

an interconnect line having a first input terminal adapted to receive a first input signal and a first output terminal removed from the first input terminal;

a first destination line;

a first pass transistor having a first current-handling terminal connected to the interconnect line, a second current-handling terminal connected to the first destination line, and a control terminal;

a first user-controlled logic element providing an output signal on a logic-element output terminal connected to the control terminal of the first pass transistor, whereby a user can intentionally adjust a delay on a path from the first input terminal to the first output terminal of the interconnect line; and a memory cell optionally providing an output signal on a memory-cell output terminal to the control terminal of the pass transistor.

5. The interconnect structure of claim 4, further comprising a logic gate, the logic gate including:

a first logic-gate input terminal connected to the logic-element output terminal;

a second logic-gate input terminal connected to the memory-cell output terminal; and a logic-gate output terminal connected to the control gate of the pass transistor;

wherein a programmed state of the memory cell determines whether a state of the pass transistor is controlled by a signal on the logic-element output terminal.

6. An interconnect structure for a programmable logic device, the interconnect structure comprising:

an interconnect line having a first input terminal adapted to receive a first input signal and a first output terminal removed from the first input terminal;

a first destination line;

a first pass transistor having a first current-handling terminal connected to the interconnect line, a second current-handling terminal connected to the first destination line, and a control terminal; and a first user-controlled logic element providing an output signal on a logic-element output terminal connected to the control terminal of the first pass transistor, whereby a user can intentionally adjust a delay on a path from the first input terminal to the first output terminal of the interconnect line, wherein the user-controlled logic element comprises a random number generator.

7. The interconnect structure of claim 1, wherein the interconnect line comprises a signal path having an associated variable delay period.

8. An interconnect structure for a programmable logic device, the interconnect structure comprising:

an interconnect line having a first input terminal adapted to receive a first input signal and a first output terminal removed from the first input terminal, wherein the interconnect line comprises a signal path having an associated variable delay period;

a first destination line;

a first pass transistor having a first current-handling terminal connected to the interconnect line, a second current-handling terminal connected to the first destination line, and a control terminal;

a first user-controlled logic element providing an output signal on a logic-element output terminal connected to the control terminal of the first pass transistor, whereby a user can intentionally adjust a delay on a path from the first input terminal to the first output terminal of the interconnect line; and means for incrementing a duration of the delay period.

9. An interconnect structure for a programmable logic device, the interconnect structure comprising:

an interconnect line having a first input terminal adapted to receive a first input signal and a first output terminal removed from the first input terminal, wherein the interconnect line comprises a signal path having an associated variable delay period;

a first destination line;

a first pass transistor having a first current-handling terminal connected to the interconnect line, a second current-handling terminal connected to the first destination line, and a control terminal;

a first user-controlled logic element providing an output signal on a logic-element output terminal connected to the control terminal of the first pass transistor, whereby a user can intentionally adjust a delay on a oath from the first input terminal to the first output terminal of the interconnect line; and means for randomly selecting a duration of the delay period.

10. The interconnect structure of claim 9, wherein the means for randomly selecting the duration of the delay period comprises a random number generator.

11. The interconnect structure of claim 1, further comprising:

a second destination line;

a second pass transistor having a first current-handling terminal connected to the interconnect line, a second current-handling terminal connected to the second destination line, and a control terminal; and a second user-controlled logic element providing an output signal on a second logic-element output terminal connected to the control terminal of the second pass transistor, whereby the user can intentionally adjust the delay on the path from the first input terminal to the first output terminal of the interconnect line.

12. An interconnect structure for a programmable logic device, the interconnect structure comprising:

an interconnect line having an input terminal adapted to receive an input signal and an output terminal removed from the input terminal;

a capacitive element;

a pass transistor having a first current-handling terminal connected to the interconnect line, a second current-handling terminal connected to the capacitive element, and a control terminal; and a user-controlled logic element providing an output signal to the control terminal of the pass transistor, whereby the user can intentionally adjust a delay on a path from the input terminal to the output terminal of the interconnect line, wherein the logic element comprises a logic-element input terminal adapted to receive a second input signal from a source external to the programmable logic device.

13. The interconnect structure of claim 12, wherein the capacitive element is a second interconnect line.

14. A method for adjusting a signal propagation delay from an input terminal of an FPGA interconnect structure to a signal destination, the method comprising the steps of:

connecting selected interconnect lines of the interconnect structure to define a signal path from the input terminal to the signal destination, the interconnect lines exhibiting a capacitive load of a first capacitance value;

providing an input signal from a source external to the FPGA, the input signal designating a second capacitance value; and connecting a capacitive element to at least one of the selected interconnect lines while the FPGA is operational, thereby increasing the capacitive load from the first capacitance value to the second capacitance value.

15. The method of claim 14, wherein the capacitive element is an interconnect line.

16. A structure for adjusting the delay on a signal line by adjusting a capacitance on the signal line, the structure comprising:

at least one switch for connecting another line to the signal line, the another line being a programmable interconnect line that is otherwise unused;

a constant signal for controlling the switch;

a user logic signal for controlling the switch; and means for selecting between the constant signal and the user logic signal.

* * * * *